(12) United States Patent
Hartmann et al.

(10) Patent No.: US 9,219,246 B2
(45) Date of Patent: Dec. 22, 2015

(54) ORGANIC ELECTRONIC DEVICE WITH ENCAPSULATION

(75) Inventors: Sören Hartmann, Baesweiler (DE); Holger Schwab, Aachen (DE); Herbert Lifka, Son (NL); Herbert Friedrich Boerner, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/877,689

(22) PCT Filed: Oct. 6, 2011

(86) PCT No.: PCT/IB2011/054407
§ 371 (c)(1),
(2), (4) Date: Apr. 4, 2013

(87) PCT Pub. No.: WO2012/049594
PCT Pub. Date: Apr. 19, 2012

(65) Prior Publication Data
US 2013/0217168 A1  Aug. 22, 2013

(30) Foreign Application Priority Data
Oct. 12, 2010 (EP) ..................... 10187219

(51) Int. Cl.
*H01L 21/00* (2006.01)
*H01L 51/52* (2006.01)
*H01L 51/44* (2006.01)
*H01L 27/32* (2006.01)

(52) U.S. Cl.
CPC .......... *H01L 51/5253* (2013.01); *H01L 51/448* (2013.01); *H01L 27/3237* (2013.01)

(58) Field of Classification Search
USPC ........ 438/21–35, 64, 99; 257/40, 88, 89, 778, 257/E21.506, E23.021
See application file for complete search history.

(56) References Cited

U.S. PATENT DOCUMENTS

| | | | |
|---|---|---|---|
| 2003/0027369 A1* | 2/2003 | Yamazaki | 438/21 |
| 2003/0155573 A1* | 8/2003 | Yamazaki et al. | 257/72 |
| 2006/0060939 A1* | 3/2006 | Seto et al. | 257/531 |

FOREIGN PATENT DOCUMENTS

| | | | |
|---|---|---|---|
| JP | 2004014447 A | * | 1/2004 |
| JP | 2005266616 A | | 9/2005 |
| WO | 2004032575 A1 | | 4/2004 |

OTHER PUBLICATIONS

Shih-Nan et al; "Thin-Film Encapsulation of Thin-Cathode Organic Light-Emitting Devices", Japanese Journal of Applied Physics, vol. 46, No. 11, 2007, pp. 7432-7435.
Dr. Emilie Galand; Thin-Film Encapsulation of Organic Light-Emitting Devices (OLEDs), Huntsman Advanced Materials, CSEM—Plastic Optoelectronics—Basel, Jun. 25, 2010, pp. 1-17.

* cited by examiner

*Primary Examiner* — Alexander Ghyka
*Assistant Examiner* — Abdulfattah Mustapha
(74) *Attorney, Agent, or Firm* — Meenakshy Chakravorty

(57) ABSTRACT

The invention relates to an organic electronic device, particularly an OLED device (100), and to a method for its manufacturing. The device (100) comprises at least one functional unit (LU1, LU2, LU3) with an organic layer (120). On top of this functional unit (LU1, LU2, LU3), at least one inorganic encapsulation layer (140, 141) and at least one organic encapsulation layer (150, 151) are disposed in which at least one conductive line (161, 162) is embedded. In this way an OLED with a thin film encapsulation can be provided that can electrically be contacted at contact points (CL) on its back side.

17 Claims, 5 Drawing Sheets

US 9,219,246 B2

ORGANIC ELECTRONIC DEVICE WITH ENCAPSULATION

FIELD OF THE INVENTION

The invention relates to an organic electronic device, for example an Organic Light Emitting Diode (OLED), comprising at least one functional unit that is encapsulated by additional layers. Moreover, it comprises a method for the manufacturing of such a device.

BACKGROUND OF THE INVENTION

From the WO 2004/32575 A1, a light emitting display is known that comprises a transparent substrate with an anode layer, on which an array of organic electroluminescent units with cathode layers on top is disposed. The array is covered by an SiN layer and a photoresist layer that are structured to provide openings for contacting the anode and the cathodes.

SUMMARY OF THE INVENTION

Based on this background, it was an object of the present invention to provide means for an alternative manufacturing of organic electronic devices, particularly means that are flexible with respect to the two-dimensional shape of the devices.

This object is achieved by an organic electronic device and a method described herein.

According to a first aspect, the invention relates to anorganic electronic device, for example to an OLED device comprising at least one Organic Light Emitting Diode ("OLED") structure. The organic electronic device shall comprise the following components:

a) At least one functional unit that comprises an organic layer.

b) An inorganic "encapsulation layer" that is disposed above the aforementioned functional unit, covering it at least partially (e.g. with the exception of particular openings). The inorganic encapsulation layer typically serves as a water diffusion barrier protecting the sensitive (organic) layers below it. It should be noted that the use of the expression "above" for the location of the inorganic encapsulation layer implies a convention according to which the direction from the functional unit to the inorganic encapsulation layer corresponds to the direction of "bottom to top" and fixes the meaning of the relative terms "below", "on top" etc.

c) An organic "encapsulation layer" that is disposed on top of the aforementioned inorganic encapsulation layer. Preferably, both the inorganic and the organic encapsulation layers are laterally structured, i.e. they cover the functional unit completely with the exception of dedicated openings.

e) At least one conductive line that is at least partially embedded in the (inorganic and organic) encapsulation layers and that is accessible from the outside of the device at, at least one contact point. Preferably, the conductive line extends at least partially into one of the aforementioned openings in the encapsulation layers and contacts the functional unit below. The conductive line may for example be made from a metal or a conductive oxide like ITO or ZnO. Moreover, it may have any shape, for example that of a line, of a grid etc.

According to a second aspect, the invention relates to a method for manufacturing an organic electronic device, particularly a device of the kind described above. The method comprises the following steps:

a) Producing at least one functional unit with an organic layer.

b) Depositing an inorganic encapsulation layer above of the functional unit.

c) Depositing a structured organic encapsulation layer on top of the inorganic encapsulation layer. Structuring of this layer can be achieved in any known way, for example by deposition through a mask or by etching.

d) Etching the inorganic encapsulation layer to create at least one opening.

e) Depositing at least one conductive line in said opening such that it is at least partially embedded in the encapsulation layers and accessible from the outside at a contact point.

It should be noted that the above steps a) to e) may be executed in the listed or any other appropriate order, including as many repetitions of steps as desired.

The method can particularly be used to manufacture an organic electronic device of the kind described above. Reference is therefore made to the above description of this device for more information on the details of the method.

The organic electronic device and the method described above have the advantage that they provide a device with an encapsulation of the sensitive layers, wherein said encapsulation simultaneously embeds conductive lines that are e.g. needed to electrically contact the functional unit(s). Moreover, it turns out that the manufacturing method is particularly suited for a flexible production of devices (e.g. OLEDs) with free-forms of their two-dimensional shapes.

In the following, preferred embodiments of the invention will be described that relate both to the organic electronic device at the method described above.

The functional unit of the organic electronic device is preferably disposed on a substrate that provides mechanical stability and protection from the bottom side, wherein the (inorganic and organic) encapsulation layers encapsulate (seal) the functional unit on said substrate. The substrate may optionally be transparent, for example being composed of glass or transparent plastic, to allow the passage of light through the bottom side (e.g. in case of an OLED device or solar cell).

In another embodiment of the invention, a plurality of functional units is disposed on a common substrate. In this way a plurality of functionally active areas can be created that can, if they are individually contacted, separately be controlled. Most preferably, such an arrangement may just constitute an intermediate product from which single devices can be obtained by cutting the common substrate between the functional units. Thus it is for instance possible to obtain free-form OLEDs with substantially any shape that is desired in the application at hand.

The stacking of an inorganic and an organic layer can optionally be repeated as often as desired, yielding a structure in which at least one additional inorganic encapsulation layer and one additional organic encapsulation layer are disposed on the (first) organic encapsulation layer. The additional encapsulation layers may also embed the conductive line, or they may be located above it.

The inorganic encapsulation layer (or layers, if several of them are applied), the organic encapsulation layer(s) and/or the conductive line(s) may optionally be deposited by structured deposition techniques. For organic layers, these techniques may preferably comprise evaporation (particularly evaporation through a mask), printing, plotting, and/or slot die coating. For inorganic layers, these techniques may preferably comprise evaporation, sputtering, atomic layer deposition and/or PECVD (plasma enhanced chemical vapor deposition). Furthermore, lithographic steps such as (UV-) light exposure and etching might be used to structure the organic encapsulation layer.

The inorganic encapsulation layer(s) may particularly comprise silicon nitride (SiN), Silicon OxyNitride (SiON), SiC, AlO, SiCN, $Al_2O_3$, $SiO_2$, $TiO_2$, and/or $ZrO_2$ etc.

The material of the organic encapsulation layer(s) may particularly comprise polymers, e.g. acrylates, polycarbonate, and/or polyimides. Moreover, it may comprise small molecules which may be crosslinked on the substrate afterwards.

In order to minimize the size and weight of the final organic electronic device and to preserve as much flexibility as possible, the thickness of the layers that are disposed above the functional unit is preferably smaller than 200 μm, most preferably smaller than 50 μm. In this case it can be said that the encapsulation layers provide a "thin film encapsulation" for the device.

Optionally an additional organic layer may be disposed between the first inorganic encapsulation layer and the functional unit. The material of the additional organic layer may for example be chosen from polymers like acrylates and/or polycarbonates.

The conductive line shall usually provide electrical access to the interior components of the organic electronic device. To this end, the conductive line has the at least one external contact point at which it can be contacted by an external (power supply and control-) circuit. In one embodiment of the invention, at least one such external contact point of the conductive line is disposed above the functional unit.

In another embodiment of the invention, the conductive line (or at least one of several conductive lines, if applicable) is covered on its top side by an organic encapsulation layer. In this case the conductive line and the functional unit contacted by it can optimally be sealed with respect to the environment.

At least one of the contact points of the conductive line may optionally be disposed laterally of the functional unit. This arrangement allows the encapsulation layers to cover the whole area of the functional unit, i.e. without a breakthrough for a conductive line. The embodiment therefore provides a highly robust encapsulation of the functional unit.

In a further development of the method for manufacturing an organic electronic device, the functional unit provided in step a) of the method is processed, too. In particular, the functional unit may be segmented (i.e. at least partially divided into two or more parts) by etching it through the at least one opening that was created in the inorganic encapsulation layer in step d) of the method. After this segmentation, the further manufacturing may proceed as usual, i.e. by depositing at least one conductive line etc.

As an example, the aforementioned approach can be used to provide a segmented OLED lighting tile. Blue, green and red emitting organics could for instance be evaporated in stripes, with an unstructured metal on top. Thereafter, the metal layer can be structured with the method described here.

The functional unit of the organic electronic device may particularly be a light emitting unit. Such a light emitting unit may especially have an OLED structure, comprising the following stack of layers: and "anode layer" (i.e. an electrically conductive layer which is typically—but not necessarily—operated as an anode), an organic electroluminescent layer, and a "cathode layer" (i.e. an electrically conductive layer which is typically—but not necessarily—operated as a cathode). The mentioned layers may themselves be constituted of several sub-layers, and the stack may comprise additional layers, too. The basic design of this functional unit corresponds however to that of on OLED as it is well known to a person skilled in the art.

Besides an OLED, other particular embodiments of the electronic device comprise a solar cell or an organic memory.

BRIEF DESCRIPTION OF THE DRAWINGS

These and other aspects of the invention will be apparent from and elucidated with reference to the embodiment(s) described hereinafter. These embodiments will be described by way of example with the help of the accompanying drawings in which.

Like reference numbers or numbers differing by integer multiples of 100 refer in the FIGS. to identical or similar components.

DESCRIPTION OF PREFERRED EMBODIMENTS

The invention will in the following be described with respect to Organic Light Emitting Diodes (OLEDs) as an exemplary organic electronic device.

Figure 1:
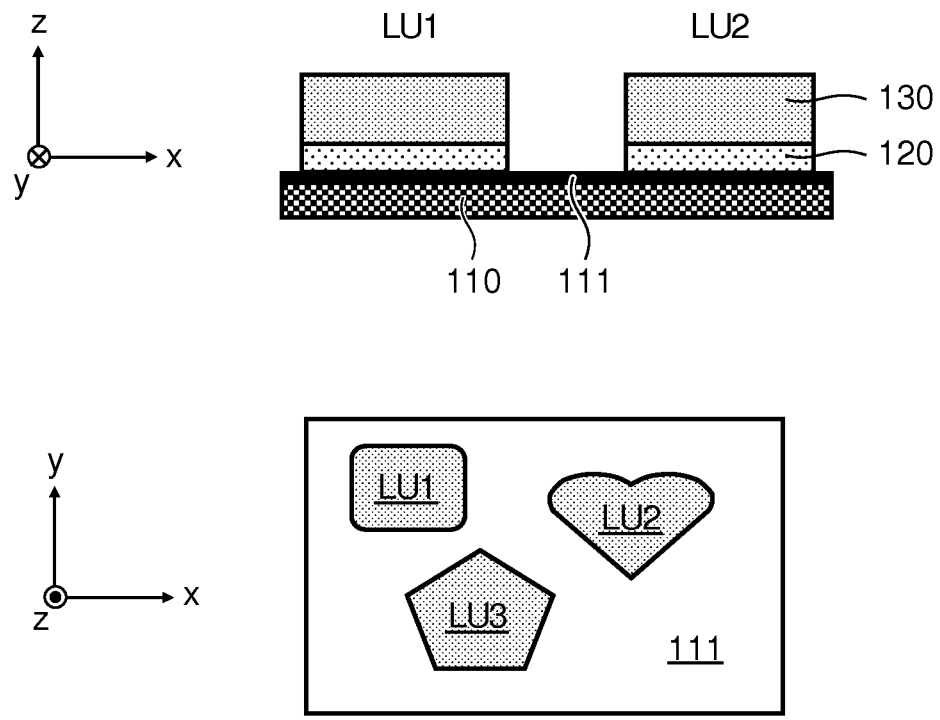
FIGS. 1-7 illustrate consecutive steps of the manufacturing of an OLED device according to a first method.

FIG. 1 schematically shows in its upper part a section through an intermediate product that may serve as a starting point for the manufacturing method according to the present invention. The lower part of the FIG. shows a top view onto this product. The product comprises a flat substrate 110, e.g. a plate of glass or transparent plastic, with a transparent anode layer 111 on top of it (e.g. ITO). Furthermore, two localized stacks are disposed on the anode layer 111, said stacks comprising an organic electroluminescent layer 120 and a cathode layer 130 on top of this. The anode layer 111, the organic electroluminescent layer 120, and the cathode layer 130 constitute "functional units", here more particularly light emitting units LU1, LU2, LU3, that are arranged on the common substrate 110. As the top view in the right part of FIG. 1 shows, that the light emitting units LU1, LU2, LU3 can freely be shaped according to the requirements in their intended application. The shape of the light emitting units can for instance be realized by using masks or plasma etch process steps.

Figure 2:
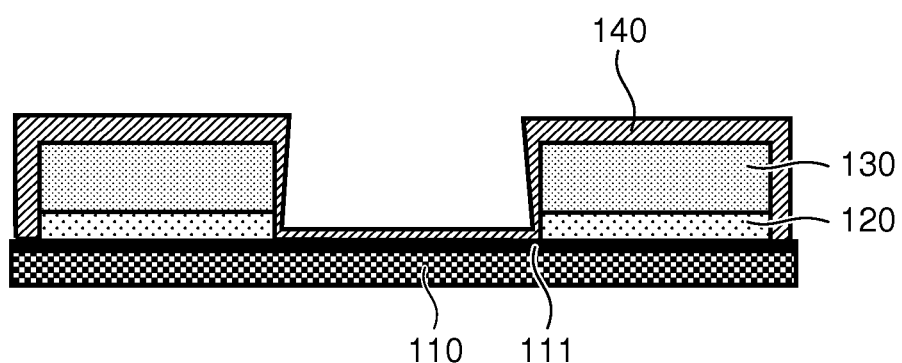

The following processing steps provide a thin film encapsulation (TFE) of the OLED device of FIG. 1. FIG. 2 shows the first step in this respect, which is the deposition of an inorganic encapsulation layer 140 (a water diffusion barrier), e.g. SiN. Alternatively, the TFE might start with the deposition of an organic layer, followed by the depicted inorganic layer.

Figure 3:
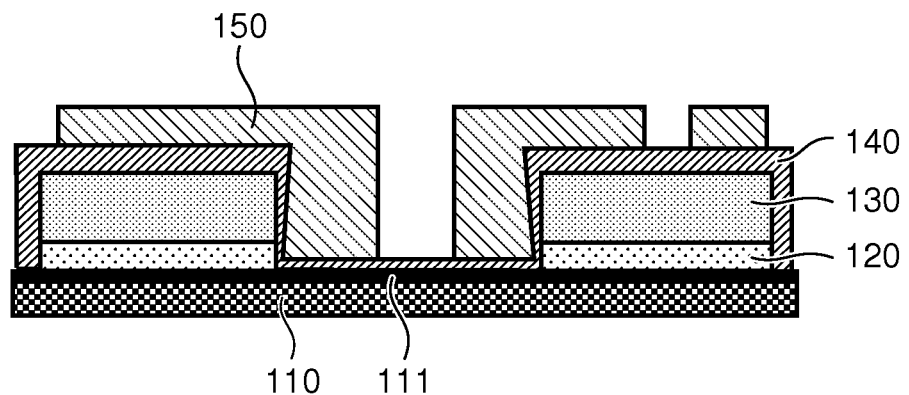

According to FIG. 3, this is followed by the deposition of an organic layer 150, e.g. a polymer with no or a low water content. For a structured deposition of the organic layer 150, a printing process can be used, e.g. ink jet printing or plotting, or a lithographic process, e.g. (UV-)light exposure and etching.

Figure 4:
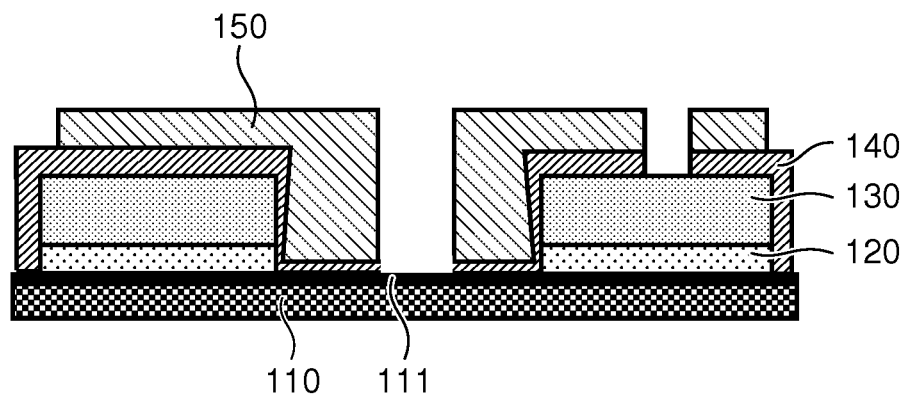

As shown in FIG. 4, the organic layer 150 can be used as a mask to structure the inorganic layer 140 below and to open contacts to the anode layer 111 and the cathode layer 130 during plasma etch process.

The process sequence of FIGS. 2-4 (inorganic layer deposition, organic layer deposition, etch process) can optionally be repeated several times (not shown).

Figure 5:
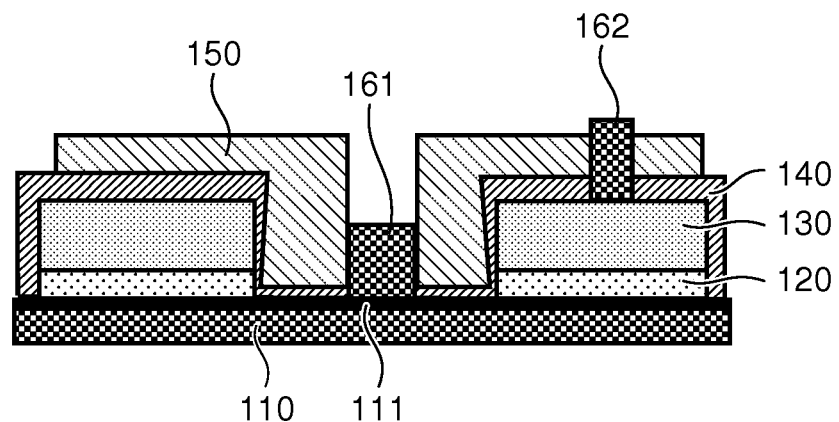

FIG. 5 shows the next (optional) process step, which is the application of conductive metal lines 161 and 162 as bus bars and/or contact lines, for example by printing or evaporation. Bus bars can be printed at the end of the manufacturing as well. They may have more elaborate shapes than contact lines, for example closed structures like a grid.

Figure 6:
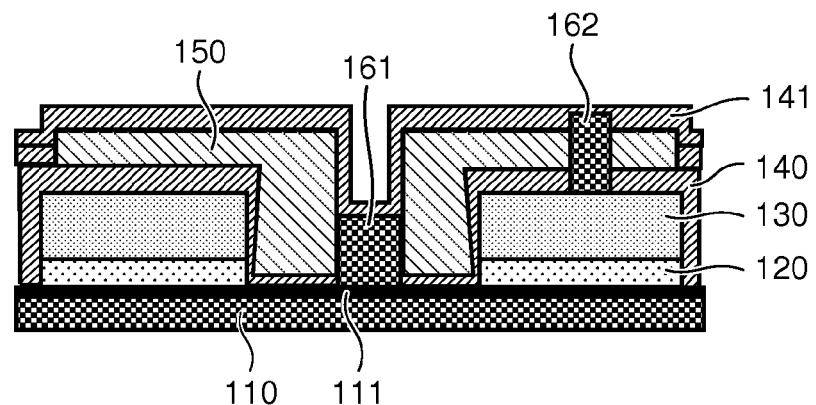
Figure 7:
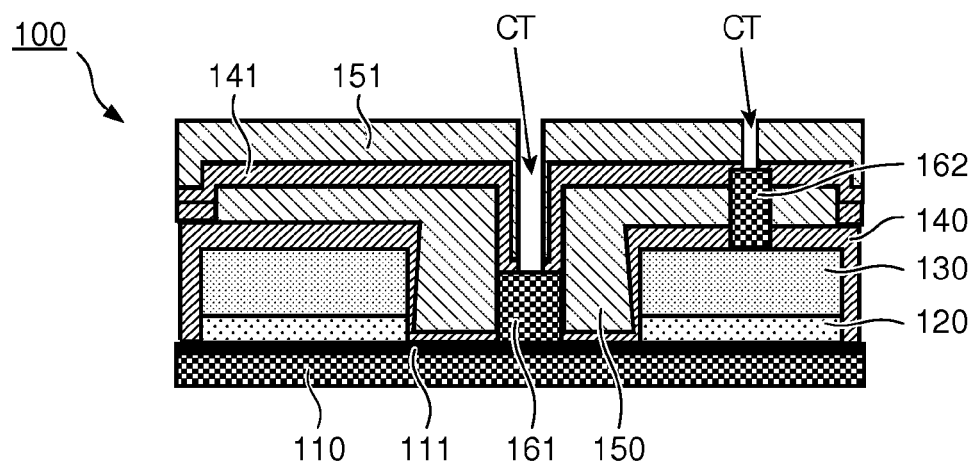

FIG. 6 shows the application of another inorganic layer 141 (e.g. a SiN layer), and FIG. 7 the application of another organic layer 151 as a Topcoat printing. If needed, another SiN etch can follow to open contact points CT to the metal lines 161, 162, yielding the final OLED device 100.

Figure 8:
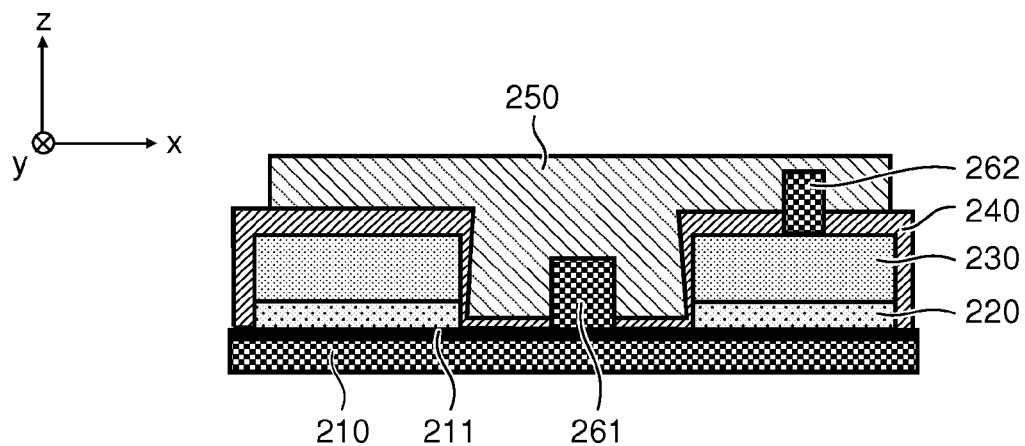
FIGS. 8-10 illustrate in sectional views and a top view an alternative manufacturing that may follow the stage shown in FIG. 5.
Figure 9:
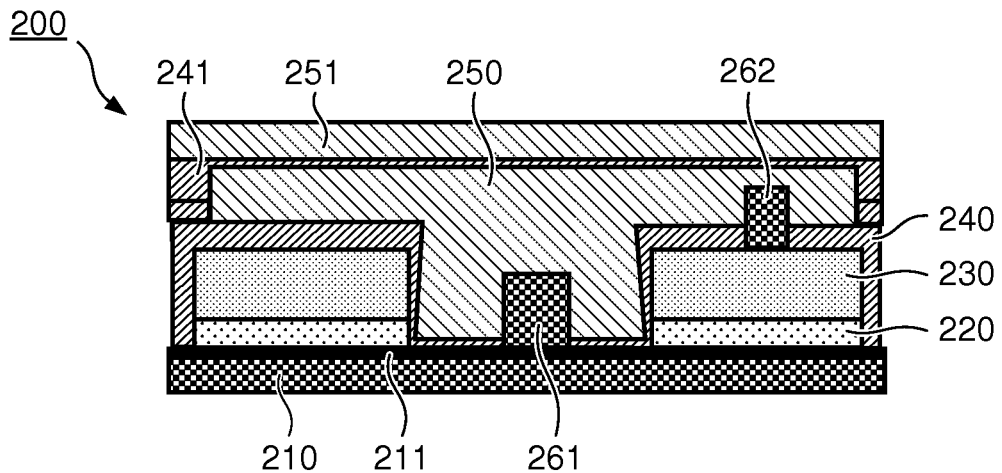
Figure 10:
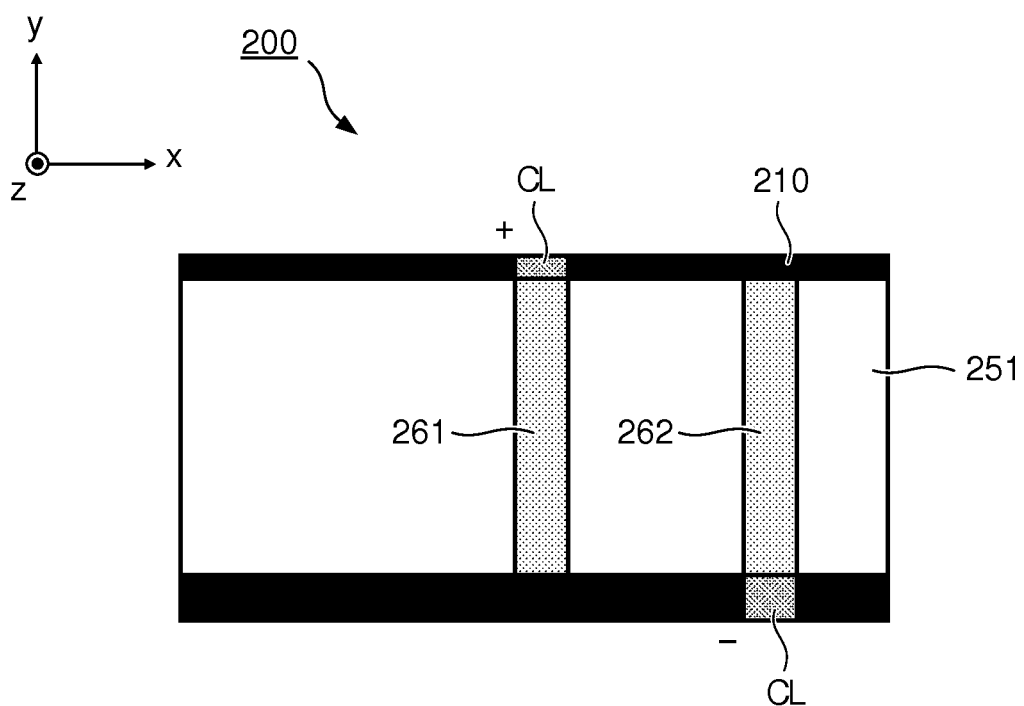

In FIGS. 8, 9 and 10, an alternative OLED device 200 is shown in a sectional view (FIGS. 8, 9) and a top view (FIG. 10). This OLED device 200 comprises a structure for embedding metal contact lines and may be obtained by alternative processing steps following the stage of FIG. 5. In particular, the metal lines 261 and 262 may first be completely embedded (besides at lateral contact points CL) in an organic encapsulation layer 250, as illustrated in the sectional view of FIG. 8. This organic encapsulation layer 250 may then further be covered by an additional inorganic layer 241 and an additional organic layer 251.

Figure 11:
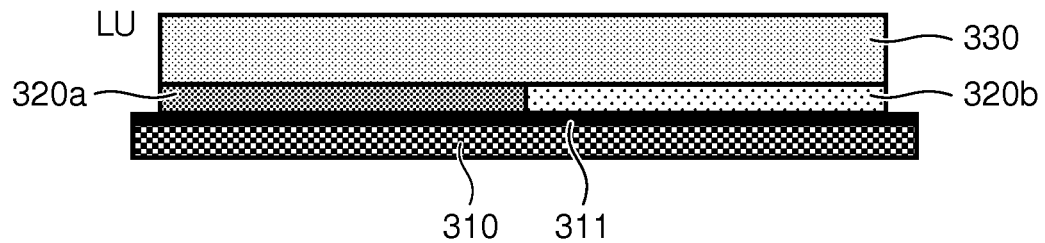
FIGS. 11-13 illustrate in sectional views a modification of the first method, comprising a segmentation of the light emitting unit by etching.
Figure 12:
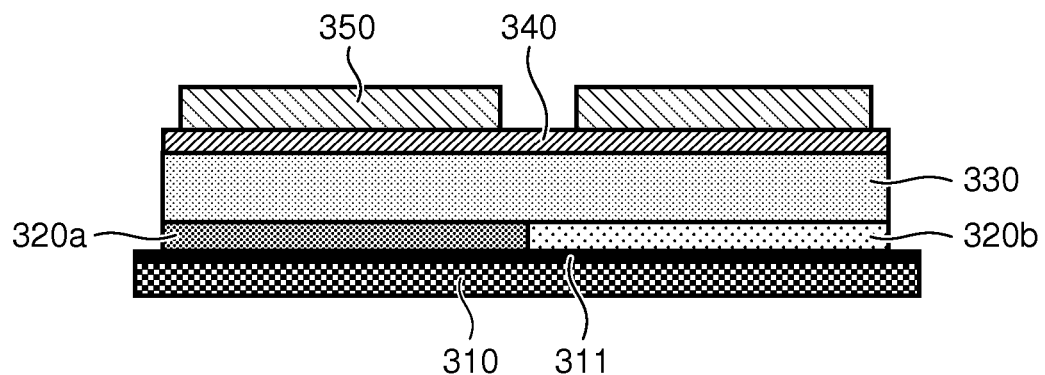
Figure 13:
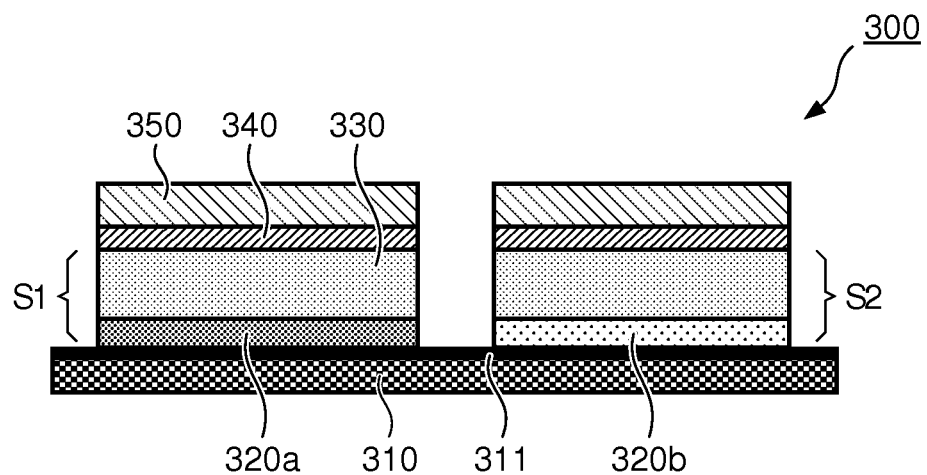

FIGS. 11 to 13 illustrate a variant that may replace the steps of FIGS. 1 to 4. According to FIG. 10, this variant starts with a substrate 310 having a (transparent) anode layer 311 and a light emitting unit LU on top. The light emitting unit LU is composed of two stripes 320a and 320b of different organic electroluminescent materials (e.g. emitting red and blue), carrying a cathode layer 330 on top. Of course more than two stripes (of different color) could be used as well.

According to FIG. 12, an unstructured inorganic layer 340 and a structured organic layer 350 are then deposited on the light emitting unit LU. This step is similar to what is shown in FIGS. 2 and 3.

In the step shown in FIG. 13, the inorganic layer 340, the cathode layer 330, and the organic electroluminescent layers 320a, 320b have been etched, using the top organic layer 350 as a mask. In this way several light emitting segments S1, S2 are generated on the substrate 310. Of course further openings may be created in this way (not shown), too, particularly for providing access to the electrode layers. Moreover, the further processing may proceed as illustrated in FIGS. 5 to 10, i.e. by connecting the electrode layers to conductive lines and by encapsulating the segments S1, S2. As a result of the described procedure, a segmented OLED lighting tile 300 is provided.

In summary, the preferred embodiments of the invention described above comprise the following features:
- a combination of a free form OLED with a free form thin film encapsulation;
- "back-side" contacting of a thin film encapsulated OLED (wherein the term "back-side" refers to the non-light emitting side of the OLED);
- free form contact pattern by plasma etching of inorganic layers;
- use of organic interlayers as etch protection for the inorganic layers;
- organic layers become larger in each deposition sequence, so side leakage is prevented;
- alternative process flow: more reliable thin film encapsulation due to embedding the contact lines into the organic layer (i.e. no disturbances of the SiN layer due to edges etc).

The invention can for instance be applied in OLED lighting, organic photovoltaics, or organic memories (MEMs).

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as emitting their scope.

The invention claimed is:

1. A method for manufacturing an organic electronic device, said method comprising:
producing at least one functional unit comprising an organic layer;
depositing an inorganic encapsulation layer above the functional unit;
depositing a structured organic encapsulation layer on top of the inorganic encapsulation layer such that at least a portion of the structured organic encapsulation layer is disposed adjacent to a lateral surface of the at least one functional unit;
etching, after said depositing the structured organic encapsulation layer on top of the inorganic encapsulation layer, the inorganic encapsulation layer to create at least one opening; and
depositing at least one conductive line in said opening such that said at least one conductive line is at least partially embedded in the encapsulation layers and accessible from outside at an external contact point.

2. The method according to claim 1, wherein the functional unit is disposed on a substrate, and wherein the encapsulation layers encapsulate the functional unit on said substrate.

3. The method according to claim 1, wherein a plurality of functional units is disposed on a common substrate.

4. The method according to claim 1, wherein at least one additional inorganic encapsulation layer and at least one additional organic encapsulation layer are disposed on the organic encapsulation layer.

5. The method according to claim 1, wherein the inorganic encapsulation layer, the organic encapsulation layer, and/or the conductive line is deposited by printing, plotting, slot die coating, evaporation, sputtering, atomic layer deposition and/or PECVD.

6. The method according to claim 1, wherein the material of the inorganic encapsulation layer comprises SiN, SiON, SiC, AlO, SiCN, $Al_2O_3$, $SiO_2$, $TiO_2$, and/or $ZrO_2$.

7. The method according to claim 1, wherein the material of the organic encapsulation layer comprises at least one polymer including an acrylate, polycarbonate, or polyimide, and/or crosslinked small molecules.

8. The method according to claim 1, wherein a thickness of the layers disposed above the functional unit is smaller than about 200 μm.

9. The method according to claim 1, wherein an additional organic layer is disposed between the inorganic encapsulation layer and the functional unit.

10. The method according to claim 1, wherein at least one external contact point (CT) is located above the functional unit, or wherein at least one external contact point (CL) is located laterally of the functional unit.

11. The method according to claim 1, wherein at least one conductive line is covered on its top side by an organic encapsulation layer.

12. The method according to claim 1, wherein the functional unit (LU) is segmented by etching through the at least one opening that was created in the inorganic encapsulation layer.

13. The method according to claim 1, wherein the functional unit is a light emitting unit.

14. The method according to claim 1, wherein the electronic device is an OLED, a solar cell, or an organic memory.

15. The method according to claim 1, wherein the structured organic encapsulation layer acts as an etch protection mask for structuring the inorganic encapsulation layer during said etching.

16. A method for manufacturing an organic electronic device, comprising:
   producing at least one functional unit comprising an organic layer;
   depositing an inorganic encapsulation layer above the functional unit;
   depositing a structured organic encapsulation layer on top of the inorganic encapsulation layer such that at least a portion of the structured organic encapsulation layer is disposed adjacent to a lateral surface of the at least one functional unit;
   etching, after said depositing the structured organic encapsulation layer on top of the inorganic encapsulation layer, the inorganic encapsulation layer to create at least one opening;
   depositing at least one conductive line in said opening such that said at least one conductive line is at least partially embedded in the encapsulation layers and accessible from outside at an external contact point;
   etching through the at least one opening that was created in the inorganic encapsulation layer to segment the functional unit.

17. A method for manufacturing an organic electronic device, said method comprising:
   producing at least one functional unit comprising an organic layer;
   depositing an inorganic encapsulation layer above the functional unit;
   depositing a structured organic encapsulation layer on top of the inorganic encapsulation layer such that at least a portion of the structured organic encapsulation layer is disposed adjacent to a lateral surface of the at least one functional unit;
   depositing at least one additional inorganic encapsulation layer and at least one additional organic encapsulation layer on the organic encapsulation layer;
   etching, after said depositing the at least one additional structured organic encapsulation layers on top of the at least one additional inorganic encapsulation layer, the encapsulation layers to create at least one opening; and
   depositing at least one conductive line in said opening such that said at least one conductive line is at least partially embedded in the encapsulation layers and accessible from outside at an external contact point.

* * * * *